US012808916B2

(12) United States Patent
Ahn et al.

(10) Patent No.: US 12,808,916 B2
(45) Date of Patent: Nov. 24, 2026

(54) APPARATUS AND METHOD FOR EXTRACTING NOISE SOURCE IMPEDANCE OF ELECTRONIC DEVICE

(71) Applicant: ELECTRONICS AND TELECOMMUNICATIONS RESEARCH INSTITUTE, Daejeon (KR)

(72) Inventors: Seung-Young Ahn, Daejeon (KR); Kwang-Uk Chu, Daejeon (KR); Jae-Won Rhee, Daejeon (KR); Hyun-Woong Kim, Yongin-si (KR)

(73) Assignee: ELECTRONICS AND TELECOMMUNICATIONS RESEARCH INSTITUTE, Daejeon (KR)

( * ) Notice: Subject to any disclaimer, the term of this patent is extended or adjusted under 35 U.S.C. 154(b) by 197 days.

(21) Appl. No.: 18/754,377

(22) Filed: Jun. 26, 2024

(65) Prior Publication Data

US 2025/0298066 A1 Sep. 25, 2025

(30) Foreign Application Priority Data

Mar. 19, 2024 (KR) ........................ 10-2024-0037872

(51) Int. Cl.
*G01R 29/26* (2006.01)

(52) U.S. Cl.
CPC .................................... *G01R 29/26* (2013.01)

(58) Field of Classification Search
CPC ........................... G01R 29/26; G01R 29/0892; G01R 29/0814; G01R 29/0878; G01R 31/00; G01R 23/16; G01R 27/02
USPC .......................................................... 324/613
See application file for complete search history.

(56) References Cited

U.S. PATENT DOCUMENTS

| | | | | |
|---|---|---|---|---|
| 5,416,422 | A * | 5/1995 | Dildine | G01R 29/26 324/613 |
| 6,882,166 | B2 * | 4/2005 | Shambroom | A61B 5/0531 324/692 |
| 10,852,343 | B2 * | 12/2020 | Liu | G01R 29/26 |
| 10,928,497 | B2 * | 2/2021 | Kim | G01S 13/0209 |

(Continued)

FOREIGN PATENT DOCUMENTS

| | | | |
|---|---|---|---|
| CN | 105353226 | A | 2/2016 |
| CN | 116819172 | A | 9/2023 |
| WO | 2013/162472 | A1 | 10/2013 |

OTHER PUBLICATIONS

Han, Zhuowei, et al. "Development of a High-precision Broadband Current Probe for Non-invasive Impedance Measurements." Proceedings of the 2024 International Symposium on Integrated Circuit Design and Integrated Systems. 2024. (Year: 2024).*

(Continued)

*Primary Examiner* — Christopher P McAndrew
(74) *Attorney, Agent, or Firm* — LRK PATENT LAW FIRM

(57) ABSTRACT

Disclosed herein is an apparatus and method for extracting noise source impedance of an electronic device. The method includes calculating the impedance of the noise source of a measurement target device using a first probe and a second probe, and the number of turns of a cable wrapped around each of the first probe and the second probe may be adjusted based on the frequency range of the noise source.

20 Claims, 7 Drawing Sheets

(56) References Cited

U.S. PATENT DOCUMENTS

| | | | | |
|---|---|---|---|---|
| 2011/0241799 | A1* | 10/2011 | Wang | H03H 7/427<br>333/181 |
| 2014/0081586 | A1* | 3/2014 | Boglione | G01R 29/26<br>702/69 |
| 2021/0025931 | A1* | 1/2021 | McKinney | G01R 31/008 |
| 2021/0373056 | A1* | 12/2021 | Lyden | A61B 5/0535 |
| 2022/0208443 | A1* | 6/2022 | Kim | H01F 27/427 |

OTHER PUBLICATIONS

Amjadifard, Reza, et al. "Proposing an improved DC LISN for measuring conducted EMI noise." IEEE Transactions on Electromagnetic Compatibility 63.3 (2020): 752-761. (Year: 2020).*

Liu, Yitao, Xin Ye, and Jianchun Peng. "EMI filter design for single-phase grid-connected inverter with noise source impedance consideration." IET Power Electronics 13.17 (2020): 3963-3974. (Year: 2020).*

Zhao, Zhenyu. "Measurement setup consideration and implementation for inductively coupled online impedance extraction." arXiv preprint arXiv:2108.13102 (2021). (Year: 2021).*

Lu Wan et al., "Enhanced Impedance Measurement to Predict Electromagnetic Interference Attenuation Provided by EMI Filters in Systems with AC/DC Converters", Appl. Sci. 2022, 12, 12497. https://doi.org/10.3390/app122312497.

* cited by examiner

APPARATUS AND METHOD FOR EXTRACTING NOISE SOURCE IMPEDANCE OF ELECTRONIC DEVICE

CROSS REFERENCE TO RELATED APPLICATION

This application claims the benefit of Korean Patent Application No. 10-2024-0037872, filed Mar. 19, 2024, which is hereby incorporated by reference in its entirety into this application.

BACKGROUND OF THE INVENTION

1. Technical Field

The disclosed embodiment relates to technology for measuring impedance of an electronic device.

2. Description of Related Art

Electronic devices having high power capacity, such as PCs, are essential devices that should be protected in modern society, and countermeasures should be in place to protect these devices from external high-power electromagnetic pulses (EMP).

In order to identify and solve electromagnetic compatibility (EMC) issues such as noise generation and external electromagnetic interference (EMI) in electronic devices, it is necessary to measure impedance of the electronic devices in advance.

Among impedance measurement methods, there is an impedance measurement method using a bias tee that separates direct current (DC) and a Radio Frequency (RF) signal from each other and applies the same in order to measure noise source impedance during operation of an electronic device.

However, the impedance measurement method using a bias tee cannot be used to measure the impedance of electronic devices having high power capacity due to a rated capacity limit of a coupler, which is required for the measurement.

In order to overcome the rated capacity limit issue of the impedance measurement method using a bias tee, there is a technique of measuring impedance using a current probe. This technique extracts impedance using variation in an S-parameter measured using two current probes.

The conventional technique for measuring impedance using current probes was developed mainly in the band ranges from 300 kHz to 30 MHz for analysis of conducted emissions (CE). However, in order to analyze the effects of wide frequency band signals such as EMP, it is necessary to extend the measurable frequency range compared to the existing measurement methods.

However, the technique for measuring impedance using current probes extracts impedance by utilizing voltage induced by the current probes, so measurement accuracy is decreased as the frequency is decreased, because the induced voltage decreases at low frequencies.

SUMMARY OF THE INVENTION

An object of the disclosed embodiment is to measure noise source impedance in order to solve the problems of noise generation and external electromagnetic interference in an electronic device.

Another object of the disclosed embodiment is to overcome a rated capacity limit of a coupler used for measurement of noise source impedance.

A further object of the disclosed embodiment is to extend a measurable frequency range in order to analyze the effects of a wide frequency band signal.

A method for extracting noise source impedance of an electronic device according to an embodiment includes calculating impedance of a noise source of a measurement target device using a first probe and a second probe, and the number of turns of a cable wrapped around each of the first probe and the second probe may be adjusted based on a frequency range of the noise source.

Here, the method may include measuring initial impedance of the measurement target device using the first probe and the second probe, determining the number of turns of the cable in the first probe and the second probe, adjusting the number of turns of the cable in the first probe and the second probe to the determined number of turns of the cable, and measuring impedance of the measurement target device.

Here, measuring the initial impedance and measuring the impedance may include injecting an input signal through the first probe, receiving an output signal fed back from the measurement target device through the second probe, and calculating the impedance of the measurement target device based on an S-parameter that is a ratio between the input signal and the output signal.

Here, measuring the initial impedance may comprise measuring the impedance when the number of turns of the cable wrapped around the probe is 1.

Here, determining the number of turns may include determining an increment in the S-parameter when measuring the initial impedance; and calculating the number of turns of the cable using the determined increment in the S-parameter.

Here, the increment may be determined depending on a request of a user or specifications of measurement equipment.

Here, steps from determining the number of turns to measuring the impedance may be repeatedly performed.

Here, the method for extracting noise source impedance of an electronic device according to an embodiment may further include searching for frequency sections in each of which effectiveness of a measurement result is guaranteed for each number of turns of the cable and connecting measurement results in the found frequency sections.

An apparatus for extracting noise source impedance of an electronic device according to an embodiment includes a first probe and a second probe that are connected to a measurement target device and a measurement control unit for injecting an input signal through the first probe, receiving an output signal fed back from the measurement target device through the second probe, and calculating impedance of the measurement target device based on a ratio between the input signal and the output signal, and the number of turns of a cable wrapped around each of the first probe and the second probe may be adjusted based on a frequency range of a noise source.

Here, the number of turns of the cable wrapped around each of the first probe and the second probe may be adjusted by a result of performing: measuring initial impedance of the measurement target device using the first probe and the second probe, determining the number of turns of the cable in the first probe and the second probe, adjusting the number of turns of the cable in the first probe and the second probe to the determined number of turns of the cable, measuring the impedance of the measurement target device, searching for frequency sections in each of which effectiveness of a measurement result is guaranteed for each number of turns of the cable, and connecting measurement results in the found frequency sections.

Here, measuring the initial impedance may comprise measuring the impedance when the number of turns of the cable wrapped around the probe is 1.

Here, determining the number of turns may include determining an increment in an S-parameter when measuring the initial impedance; and calculating the number of turns using the determined increment in the S-parameter.

Here, the increment may be determined depending on a request of a user or specifications of measurement equipment.

Here, steps from determining the number of turns to measuring the impedance may be repeatedly performed.

Here, the apparatus for extracting noise source impedance of an electronic device according to an embodiment may further include a line impedance stabilization network for stabilizing line impedance depending on a frequency and isolating a power network from the measurement target device.

A method for extracting noise source impedance of an electronic device according to an embodiment may include measuring initial impedance of a measurement target device using a first probe and a second probe, determining the number of turns of a cable in the first probe and the second probe, adjusting the number of turns of the cable in the first probe and the second probe to the determined number of turns of the cable, measuring impedance of the measurement target device, searching for frequency sections in each of which effectiveness of a measurement result is guaranteed for each number of turns of the cable, and connecting measurement results in the found frequency sections.

Here, measuring the initial impedance may comprise measuring the impedance when the number of turns of the cable wrapped around the probe is 1.

Here, determining the number of turns may include determining an increment in an S-parameter when measuring the initial impedance; and calculating the number of turns of the cable using the determined increment in the S-parameter.

Here, the increment may be determined depending on a request of a user or specifications of measurement equipment.

Here, steps from determining the number of turns to measuring the impedance may be repeatedly performed.

BRIEF DESCRIPTION OF THE DRAWINGS

The above and other objects, features, and advantages of the present disclosure will be more clearly understood from the following detailed description taken in conjunction with the accompanying drawings, in which.

DESCRIPTION OF THE PREFERRED EMBODIMENTS

Figure 1:
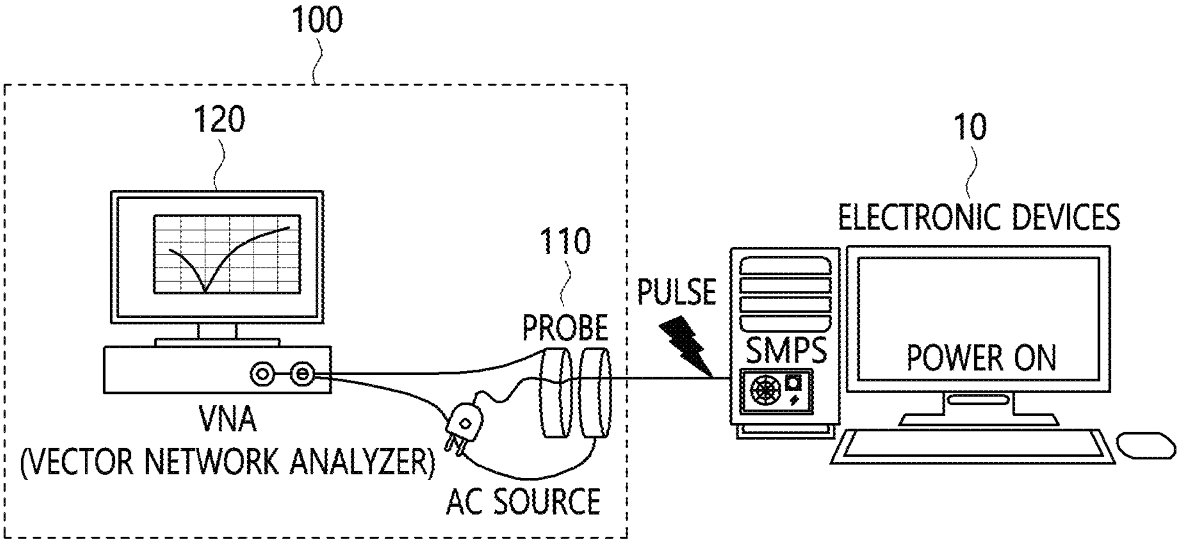
FIG. 1 is an exemplary view of installation of an apparatus for measuring noise source impedance of an electronic device according to an embodiment.

The advantages and features of the present disclosure and methods of achieving them will be apparent from the following exemplary embodiments to be described in more detail with reference to the accompanying drawings. However, it should be noted that the present disclosure is not limited to the following exemplary embodiments, and may be implemented in various forms. Accordingly, the exemplary embodiments are provided only to disclose the present disclosure and to let those skilled in the art know the category of the present disclosure, and the present disclosure is to be defined based only on the claims. The same reference numerals or the same reference designators denote the same elements throughout the specification.

It will be understood that, although the terms “first,” “second,” etc. may be used herein to describe various elements, these elements are not intended to be limited by these terms. These terms are only used to distinguish one element from another element. For example, a first element discussed below could be referred to as a second element without departing from the technical spirit of the present disclosure.

The terms used herein are for the purpose of describing particular embodiments only and are not intended to limit the present disclosure. As used herein, the singular forms are intended to include the plural forms as well, unless the context clearly indicates otherwise. It will be further understood that the terms “comprises,” “comprising,”, “includes” and/or “including,” when used herein, specify the presence of stated features, integers, steps, operations, elements, and/or components, but do not preclude the presence or addition of one or more other features, integers, steps, operations, elements, components, and/or groups thereof.

Unless differently defined, all terms used herein, including technical or scientific terms, have the same meanings as terms generally understood by those skilled in the art to which the present disclosure pertains. Terms identical to those defined in generally used dictionaries should be interpreted as having meanings identical to contextual meanings of the related art, and are not to be interpreted as having ideal or excessively formal meanings unless they are definitively defined in the present specification.

FIG. 1 is an exemplary view of installation of an apparatus for measuring noise source impedance of an electronic device according to an embodiment.

Referring to FIG. 1, the apparatus 100 for measuring noise source impedance of an electronic device according to an embodiment may be configured with a pair of current probes 110-1 and 110-2 and a measurement control unit 120.

That is, through inductive measurement using the current probes 110-1 and 110-2, which can be used for measuring the impedance of a relatively high-power electronic device, impedance is measured during the operation of the power supply of the electronic device 10.

A Vector Network Analyzer (VNA), which is the measurement control unit 120, extracts the impedance of the electronic device through the variation in an S-parameter measured using the two current probes 110-1 and 110-2.

The basic principle of this inductive coupling method will be described in detail with reference to FIG. 2 and FIG. 3.

Figure 2:
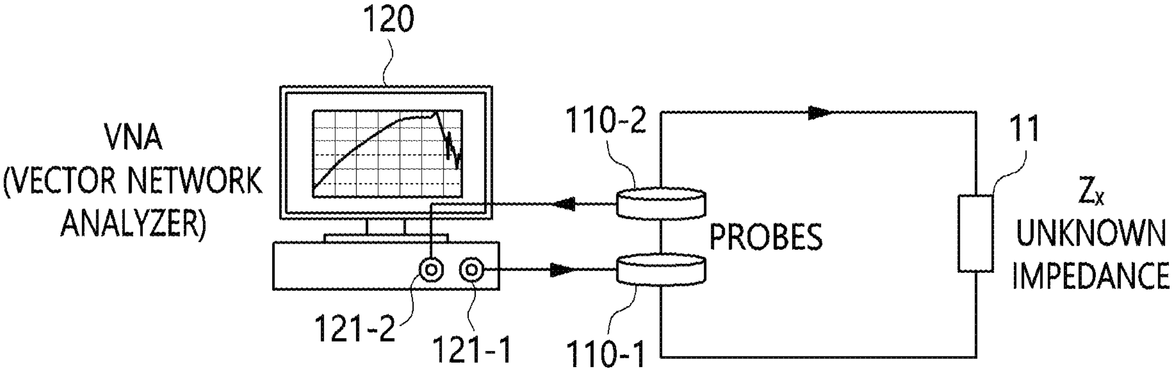
FIG. 2 is an exemplary view for explaining the impedance measurement principle of an apparatus for measuring noise source impedance of an electronic device according to an embodiment.
Figure 3:
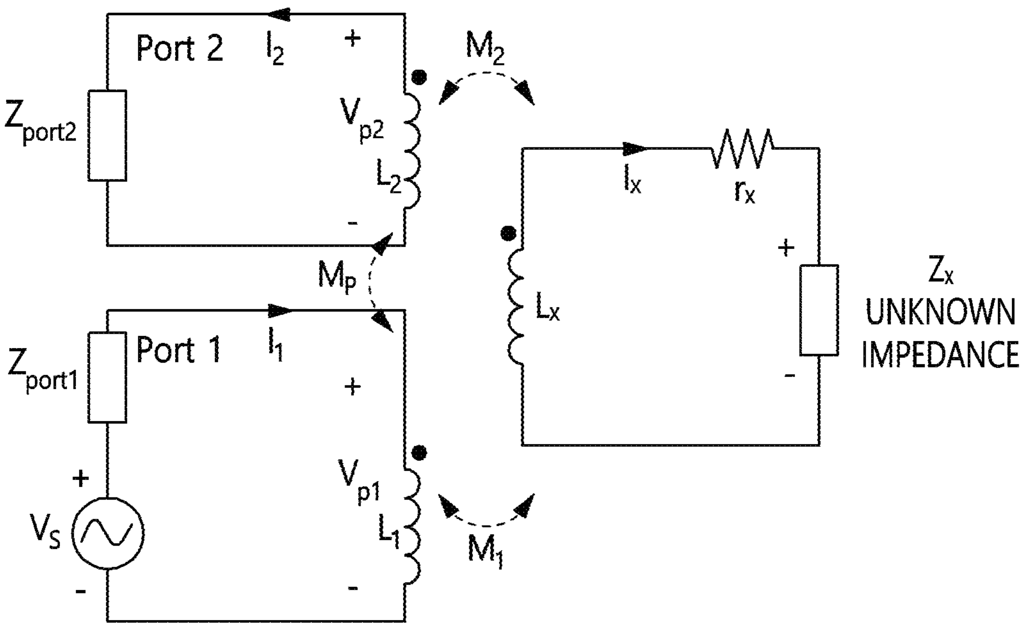
FIG. 3 is an exemplary view of the impedance measurement equivalent circuit of FIG. 2.

FIG. 2 is an exemplary view for explaining the impedance measurement principle of an apparatus for measuring noise source impedance of an electronic device according to an embodiment, and FIG. 3 is an exemplary view of the impedance measurement equivalent circuit of FIG. 2.

Referring to FIG. 2, a minute signal that is input from the first port 121-1 of the measurement control unit 120 to the first probe 110-1 is injected to the measurement target device or the circuit 10. The signal passing through the measurement target device or the circuit 10 is input to the second port 121-2 of the measurement control unit 120 through the second probe 110-2.

Accordingly, the measurement control unit 120 may measure an S-parameter through the ratio between the input signal and the output signal and extract the impedance $Z_x$ of the measurement target device 10 from the measured S-parameter.

The respective symbols represented in the equivalent circuit illustrated in FIG. 3 may be defined as shown in Table 1 below.

TABLE 1

| Symbol | Parameters |
|---|---|
| $Z_{port\ 1}$ | Matching impedance of probe 1 (50 ohm) |
| $Z_{port\ 2}$ | Matching impedance of probe 2 (50 ohm) |
| $L_1$ | Inductance of probe 1 |
| $L_2$ | Inductance of probe 2 |
| $L_x$ | Inductance of a circuit with unknown impedance |
| $r_x$ | Resistance of a circuit with unknown impedance |
| $Z_x$ | Unknown impedance |
| $I_1$ | Current flowing through the probe 1 |
| $I_2$ | Current flowing through the probe 2 |
| $I_x$ | Current flowing through the unknown impedance |
| $V_s$ | Input injecting voltage |
| $V_{p1}$ | Voltage induced in probe 1 |
| $V_{p2}$ | Voltage induced in probe 2 |
| $M_1$ | Mutual inductance between $L_1$ and $L_x$ |
| $M_2$ | Mutual inductance between $L_2$ and $L_x$ |
| $M_p$ | Mutual inductance between $L_1$ and $L_2$ |

The relationships between the values of the symbols in the equivalent circuit illustrated in FIG. 3 may be represented as shown in Equation (1) and Equation (2) below:

$$\begin{bmatrix} V_s \\ 0 \\ 0 \end{bmatrix} = \begin{bmatrix} Z_{port1} + j\omega L_1 & -j\omega M_p & -j\omega M_1 \\ -j\omega M_p & Z_{port2} + j\omega L_2 & j\omega M_2 \\ -j\omega M_1 & j\omega M_2 & r_\omega + j\omega L_x + Z_x \end{bmatrix} \times \begin{bmatrix} I_1 \\ I_2 \\ I_x \end{bmatrix} \quad (1)$$

$$\frac{V_{p1}}{V_{p2}} = \frac{S_{11} + 1}{S_{21}} \quad (2)$$

Using Equation (1) and Equation (2), the impedance $Z_x$ intended to be measured may be calculated as shown in Equation (3) below:

$$Z_x = R_{50} \frac{\left(\frac{V_{p1}}{V_{p2}}\Big|_{R_\infty} - \frac{V_{p1}}{V_{p2}}\Big|_{R_{50}}\right)\left(\frac{V_{p1}}{V_{p2}}\Big|_{Z_x} - \frac{V_{p1}}{V_{p2}}\Big|_{R_0}\right)}{\left(\frac{V_{p1}}{V_{p2}}\Big|_{R_{50}} - \frac{V_{p1}}{V_{p2}}\Big|_{R_0}\right)\left(\frac{V_{p1}}{V_{p2}}\Big|_{R_\infty} - \frac{V_{p1}}{V_{p2}}\Big|_{Z_x}\right)} \quad (3)$$

That is, the parameters defined in Table 1 above are measured values, and when the measured parameter values are substituted into Equations (1) to (3), the impedance $Z_x$ intended to be measured may be calculated in the state in which unknown impedance 11 is connected.

However, when the impedance is extracted by measuring the ratio between the voltages induced in the first probe 110-1 and the second probe 110-2 as described above, coupling is decreased as the frequency becomes lower below 1 MHz, so it may be difficult to measure the impedance.

Figure 4:
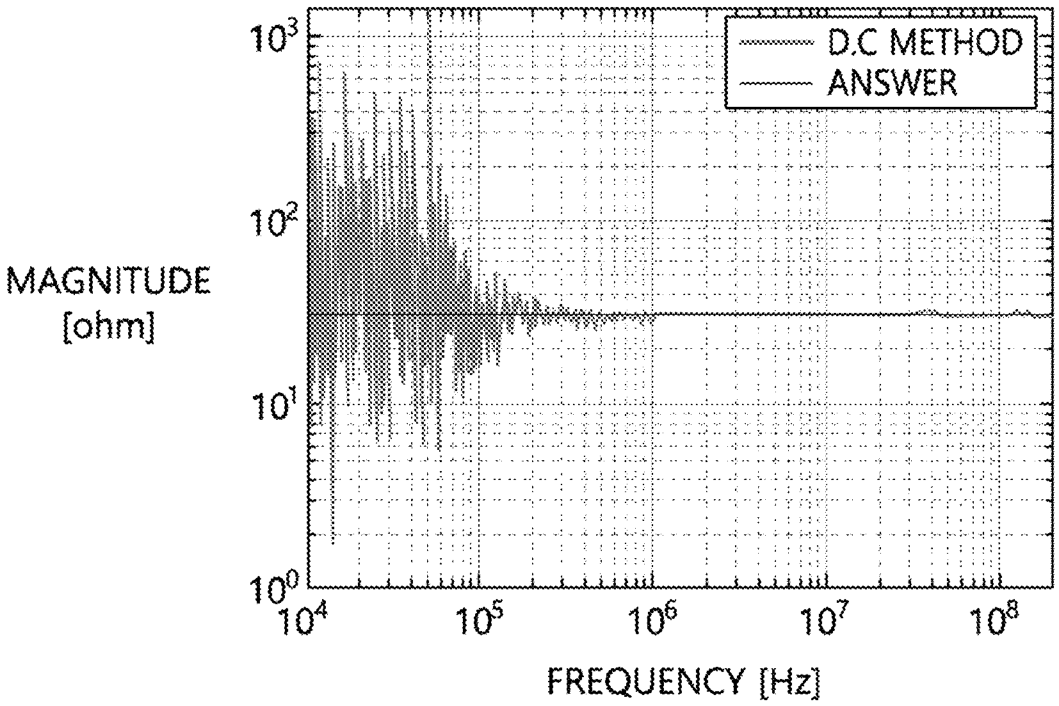
FIG. 4 is an exemplary view of a graph that shows a result of extracting impedance of a general passive device.

FIG. 4 is an exemplary view of a graph that shows a result of extracting impedance of a general passive device.

Referring to FIG. 4, 'D.C Method' (Dual Current Probe Method) indicates a result of impedance extraction, and 'Answer' indicates the magnitude of impedance represented in a data sheet.

That is, it can be seen that it is impossible to extract accurate impedance in a band equal to or less than about 1 MHz as shown in the graph illustrated as a result of measuring the impedance of a simple passive device (with the resistance of 30 ohm), rather than the impedance of an electronic device.

Accordingly, in an embodiment, it is intended to increase a signal coupled to the first probe 110-1 and the second probe 110-2 in order to improve accuracy of impedance measurement at frequencies equal to or less than 1 MHz.

To this end, in an embodiment, the number of turns of a cable wrapped around each of the first probe 110-1 and the second probe 110-2 is increased, whereby coupling between the circuits may be increased.

Figure 5:
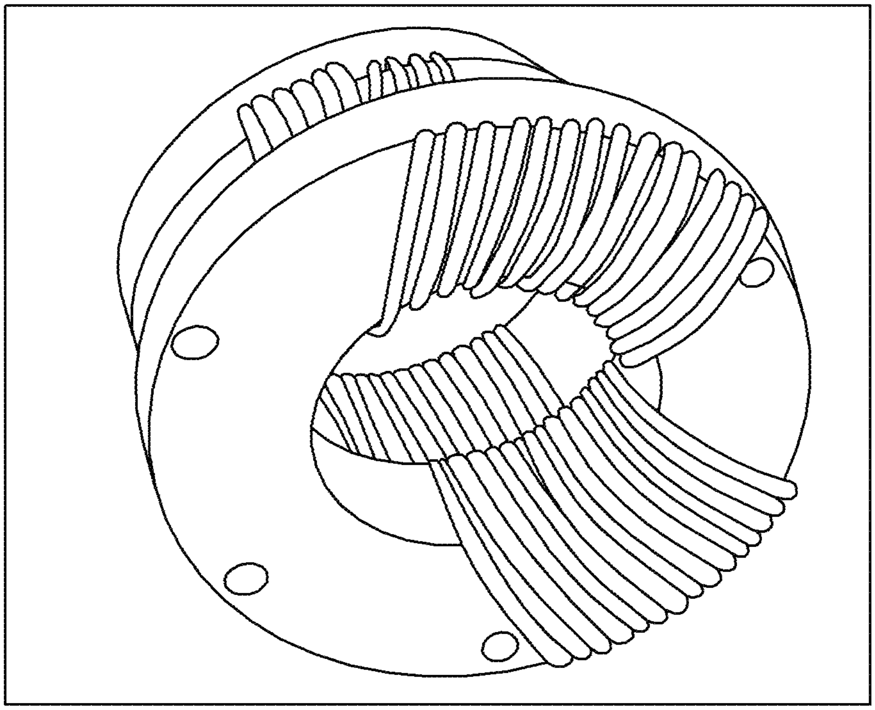
FIG. 5 is an exemplary view of an increase in the number of turns in a probe according to an embodiment.
Figure 6:
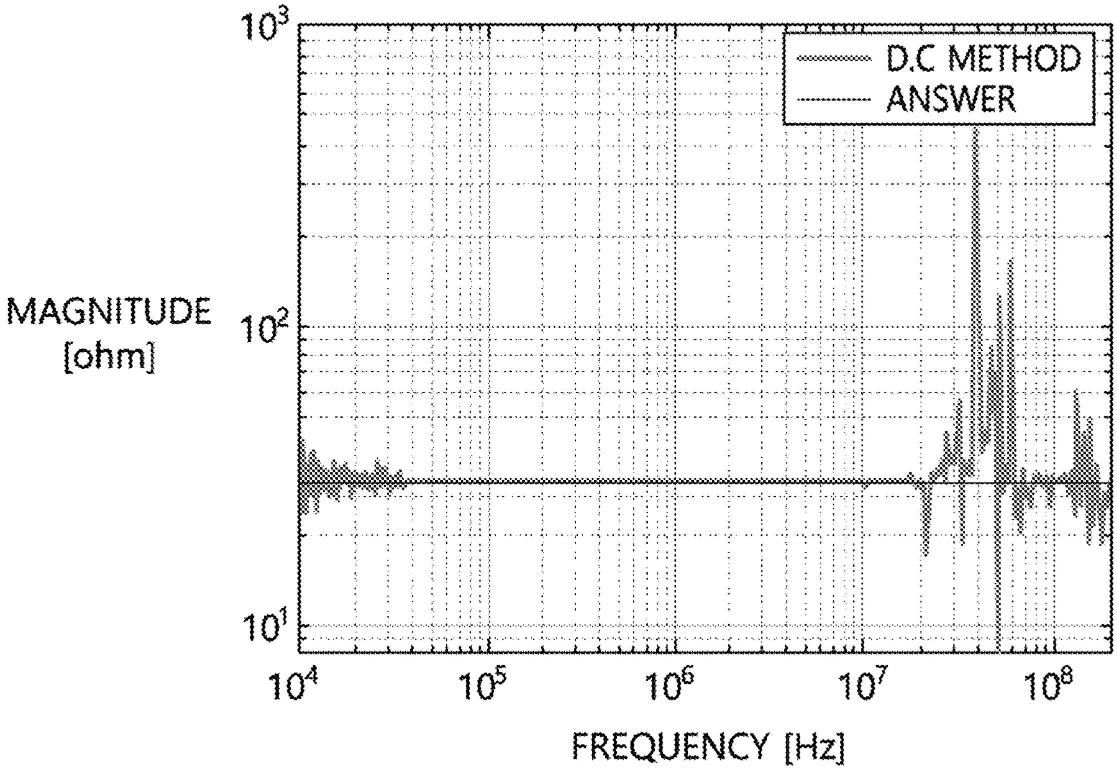
FIG. 6 is an exemplary graph that shows a result of extracting impedance of a passive device according to an embodiment.

FIG. 5 is an exemplary view of an increase in the number of turns in a probe according to an embodiment, and FIG. 6 is an exemplary graph that shows a result of extracting impedance of a passive device according to an embodiment.

When the number of turns in the probe is increased as illustrated in FIG. 5, mutual inductance between the cable and the probes 110-1 and 110-2 is increased, and induced voltages of the probes 110-1 and 110-2 are increased.

Accordingly, when the induced voltage is increased by increasing the number of turns of the cable, accuracy of impedance measurement may be improved even in a low frequency band.

FIG. 6 is a result of measuring the impedance of a passive device (with the resistance of 30 ohm) after increasing the number of turns of a cable wrapped around the probe from 1 to 15 in order to increase the induced voltage according to an embodiment.

However, referring to FIG. 6, it can be seen that the extraction accuracy increases at frequencies equal to or less than 1 MHz, but the accuracy rapidly drops at frequencies greater than about 10 MHz. This may result from a resonance phenomenon caused by the increasing length of a cable as the result of an increase in the number of turns of the cable. Accordingly, in order to increase the measurement accuracy at frequencies from about 10 kHz to 20 MHz, that is, in a frequency range in which the impedance is intended to be measured, it is necessary to adjust the number of turns depending on the frequency range before measurement.

Accordingly, in order to increase measurement accuracy in a frequency range in which measurement is to be performed (e.g., from about 10 kHz to 20 MHz), a method of adjusting the number of turns in a probe depending on a frequency range before measuring impedance is proposed in an embodiment.

Figure 7:
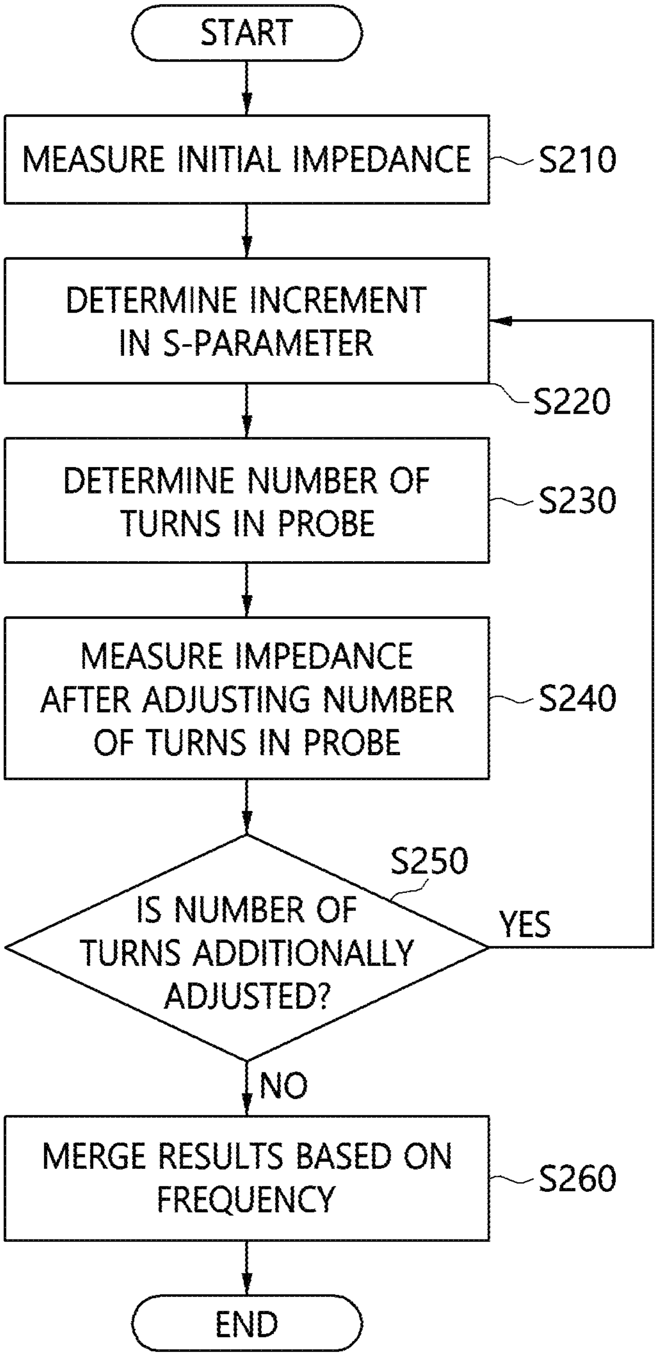
FIG. 7 is a flowchart for explaining a method for extracting noise source impedance of an electronic device according to an embodiment.

FIG. 7 is a flowchart for explaining a method for extracting noise source impedance of an electronic device according to an embodiment.

Referring to FIG. 2, FIG. 3, and FIG. 7, in the method for extracting noise source impedance of an electronic device according to an embodiment, the impedance of the noise source of a measurement target device 10 is calculated using a first probe 110-1 and a second probe 110-2, in which case the number of turns of a cable wrapped around each of the first probe 110-1 and the second probe 110-2 may be adjusted based on the frequency range of the noise source.

Specifically, the method for extracting noise source impedance of an electronic device according to an embodiment may include measuring the initial impedance of the measurement target device using the first probe and the second probe at step S210, determining the number of turns of the cable in the first probe and the second probe at steps S220 to S230, and measuring the impedance of the measurement target device after adjusting the number of turns of the cable in the first probe and the second probe to the determined number of turns of the cable at step S240.

Here, measuring the initial impedance at step S210 may comprise measuring the impedance when the number of turns of the cable wrapped around the probe is 1.

That is, using Equation (3) derived from the above-described equivalent circuit illustrated in FIG. 3, the initial impedance of the measurement target is measured.

Here, determining the number of turns of the cable at steps S220 to S230 may include determining an increment in an S-parameter when measuring the initial impedance at step S220 and calculating the number of turns of the cable using the determined increment in the S-parameter at step S230.

That is, when the increment in the S-parameter is determined at step S220, the result of measuring the S-parameter is checked, and the increment α in the S-parameter $S_{21}$ is determined.

Here, the increment α may be determined depending on a user's request or the specifications of measurement equipment.

That is, the increment may be determined in consideration of a dynamic range, which is an S-parameter range measurable by the equipment. For example, when the equipment can measure up to −70 dB, if the value measured when the number of turns is 1 (1-turn measurement value) is −90 dB, the increment may be set equal to or greater than 20 dB.

Subsequently, when the number of turns of the cable is calculated at step S230, the second voltage $V_{p2}^*$ to be induced in the second probe 110-2 may be calculated using the increment α in the S-parameter $S_{21}$ based on the already measured first voltage $V_{p2}$ induced in the second probe 110-2, as shown in Equation (4) below:

$$|V_{p2}^*| = 10^{\frac{\alpha}{20}}|V_{p2}| \tag{4}$$

Also, Equation (4) may be rearranged to Equation (5) below:

$$V_{p2}^* = j2V_1\left(-\frac{(M_2N\omega)^2}{A} - \frac{\begin{array}{c}\omega^2L_2\left(\omega M_2{}^2N^2 - L_xM_p\omega N^2 + jM_pZ_x\right) + \\ M_p\omega\left(\omega M_2{}^2N^2 - L_2L_xN^2\omega^2 + j\omega L_xZ_{p2}N^2 + Z_{p2}Z_x\right)\end{array}}{B}\right) \tag{5}$$

In Equation (5), A may be expressed as shown in Equation (6), B may be expressed as shown in Equation (7).

$$A = L_2Z_x\omega - jZ_{p2}Z_x + M_pZ_x\omega - j2(M_2N\omega)^2 + L_xN^2Z_{p2}\omega + jL_x(L_2 + M_p)(N\omega)^2 \tag{6}$$

$$B = A\cdot\left(\omega(M_p - L_2) + jZ_{p2}\right) \tag{7}$$

In Equations (5) to (7), N denotes the increased number of turns. Also, the remaining parameters excluding N are values acquired through measurement.

Here, the values of the remaining parameters may be values that are measured when the number of turns in the probes 110-1 and 110-2 is 0.

Accordingly, the increased number of turns N may be calculated by substituting the measured values into Equations (5) to (7).

Subsequently, when the impedance is measured at step S240, the number of turns of the cable in the probes 110-1 and 110-2 is adjusted to the calculated number of turns, and the impedance of the measurement target device is measured again.

Here, the number of turns in the probes 110-1 and 110-2 may be changed to an equal number of turns.

Here, each of the step of measuring the initial impedance (S210) and the step of measuring the impedance (S240) may include injecting an input signal through the first probe 110-1, receiving an output signal fed back from the measurement target device through the second probe 110-2, and calculating the impedance of the measurement target device based on the S-parameter, which is the ratio between the input signal and the output signal, as described above.

Subsequently, when it is necessary to additionally adjust the number of turns, steps S220 to S240 may be repeatedly performed.

Subsequently, the method for extracting noise source impedance of an electronic device according to an embodiment may further include searching for frequency sections in each of which the effectiveness of a measurement result is guaranteed for each number of turns of the cable and connecting the measurement results in the found frequency sections at step S260.

Figure 8:
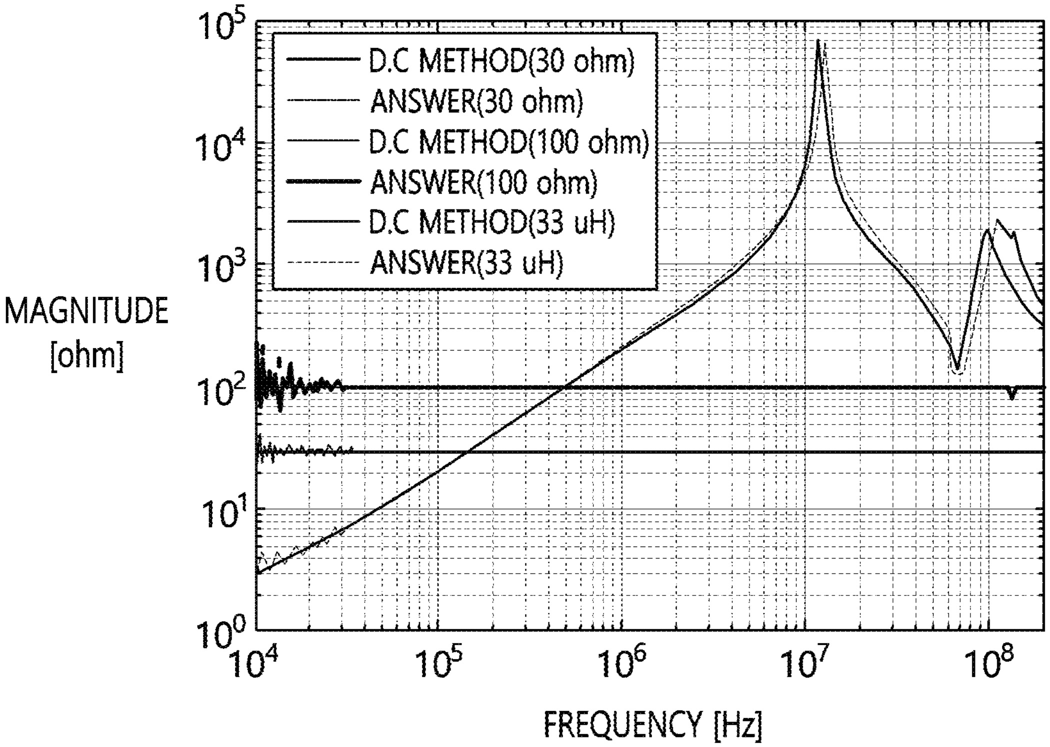
FIG. 8 is an exemplary view of a graph that shows a result of extracting impedance of a passive device by varying the number of turns for each frequency according to an embodiment.

FIG. 8 is an exemplary view of a graph that shows a result of extracting impedance of a passive device by varying the number of turns for each frequency according to an embodiment.

FIG. 8 is an exemplary graph of an impedance extraction result acquired after the measurement results in the found frequency sections are connected at step S260 according to an embodiment. In the graph, the impedance measurement result at frequencies up to about 3 MHz is the result acquired when the number of turns is 1, and the impedance measurement result in a band greater than 3 MHz is the result of measuring the impedance of a passive device after the number of turns is increased to 15.

In the example of FIG. 8, impedance extraction is performed by selecting a total of three passive devices in order to determine the effectiveness of the proposed method for various impedance magnitudes.

As a result of measurement, it can be seen that impedance may be measured at frequencies from about 10 kHz to 200 MHz using the proposed method. Accordingly, when this method is applied, impedance may be extracted in an extended frequency range during the operation of a high-power device such as a PC.

Figure 9:
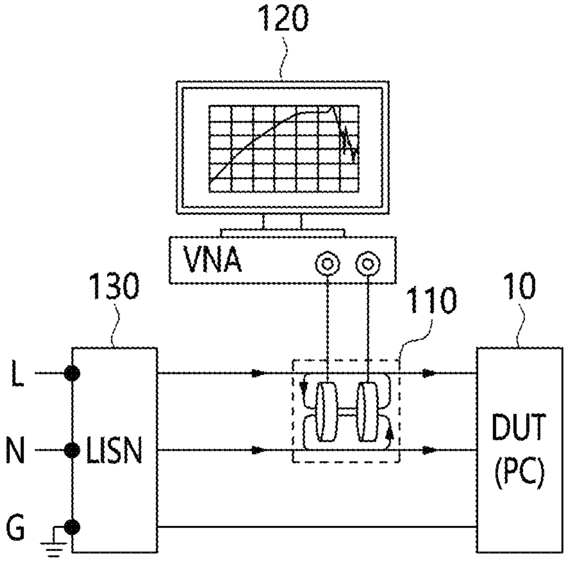
FIG. 9 is an exemplary view of differential mode impedance measurement according to an embodiment.
Figure 10:
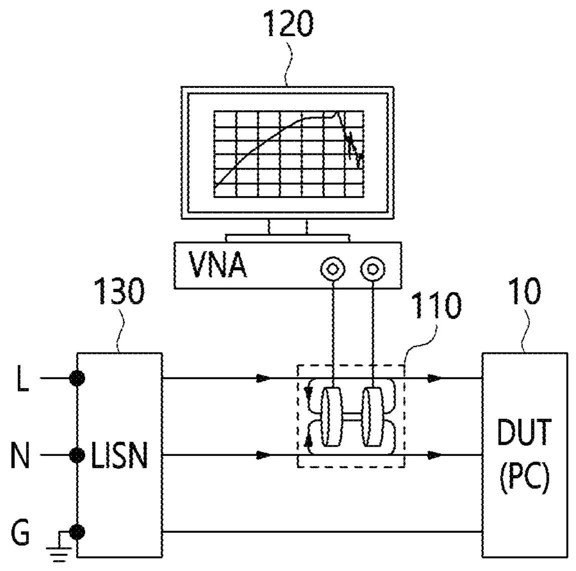
FIG. 10 is an exemplary view of common mode impedance measurement according to an embodiment.

Before measuring the impedance of an electronic device, the effectiveness of the method is verified using the impedance of a passive device of which the impedance information is known, as described above, and when noise source impedance is measured during the operation of the actual device, measurement of the setups shown in FIG. 9 and FIG. 10 may be required.

FIG. 9 is an exemplary view of differential mode impedance measurement according to an embodiment, and FIG. 10 is an exemplary view of common mode impedance measurement according to an embodiment.

Referring to FIG. 9 and FIG. 10, an apparatus for extracting noise source impedance of an electronic device according to an embodiment may further include a Line Impedance Stabilization Network (LISN) 130 for stabilizing line impedance depending on a frequency and isolating a power network from a measurement target device (Device Under Test (DUT)) 10.

Also, in order to measure the differential mode noise source impedance of FIG. 9 and the common mode noise source impedance of FIG. 10, the impedance measurement method is differentiated depending on the direction of current passing through the probe 110, and the noise source impedance may be measured by varying the number of turns in the probe depending on the frequency, as described above with reference to FIG. 7.

According to the embodiment described above, the frequency of measurable noise may be extended, and impedance information may be used in more diverse fields.

For example, impedance information at frequencies from tens to hundreds kHz is required for designing a noise filter of a power conversion system, and in this case, the proposed method may be used. Additionally, the proposed method is expected to be used in various fields, such as diagnosis of failures in motors, power systems, and the like.

Also, when noise source impedance is measured, the amount of generated noise can be predicted, whereby a solution for an electromagnetic compatibility (EMC) problem may be presented.

Most commercial electronic devices have the EMC standard that they have to pass. Accordingly, through accurate noise source impedance measurement, the possibility to solve the EMC problem may be secured.

Figure 11:
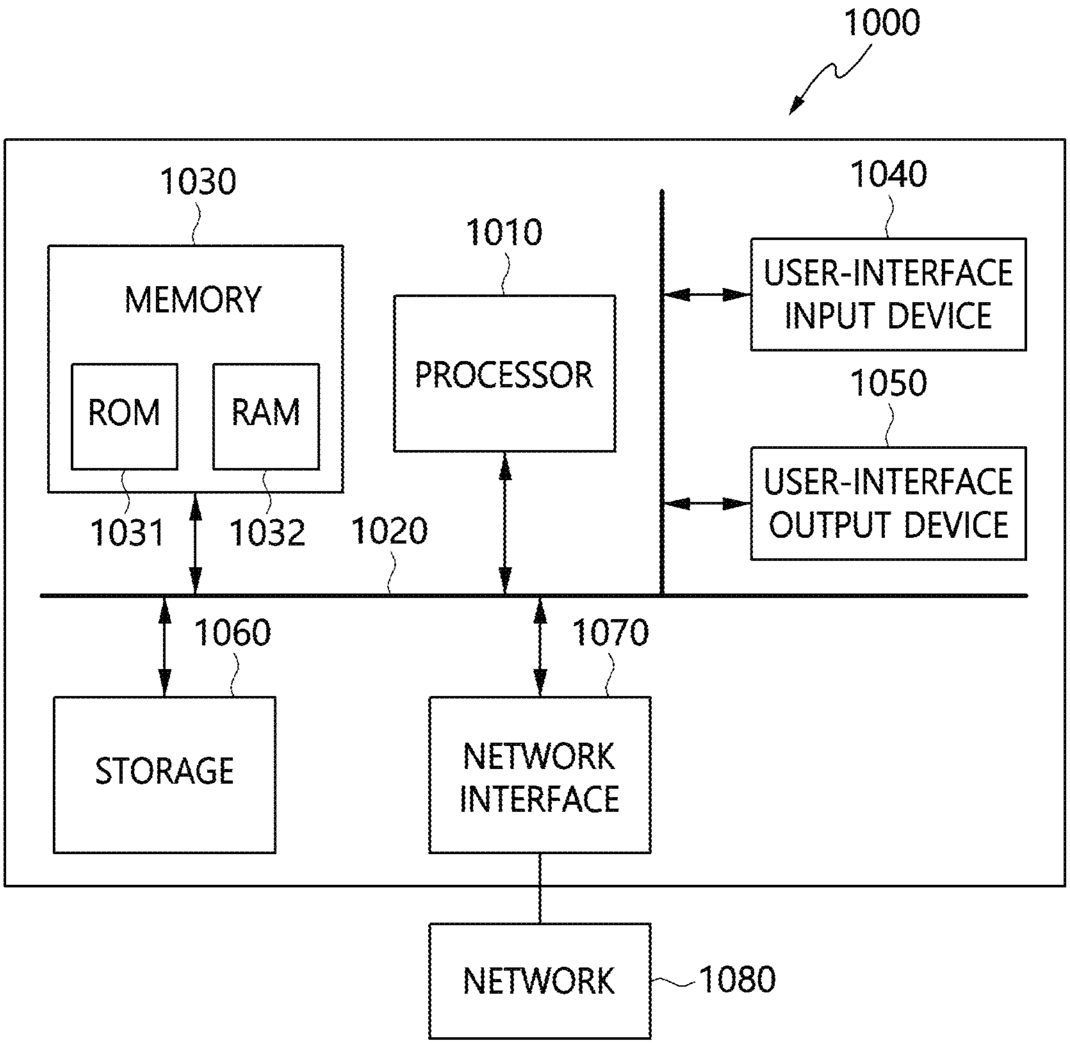
FIG. 11 is a view illustrating a computer system configuration according to an embodiment.

FIG. 11 is a view illustrating a computer system configuration according to an embodiment.

The measurement control unit 120 according to an embodiment may be implemented in a computer system 1000 including a computer-readable recording medium.

The computer system 1000 may include one or more processors 1010, memory 1030, a user-interface input device 1040, a user-interface output device 1050, and storage 1060, which communicate with each other via a bus 1020. Also, the computer system 1000 may further include a network interface 1070 connected with a network 1080. The processor 1010 may be a central processing unit or a semiconductor device for executing a program or processing instructions stored in the memory 1030 or the storage 1060. The memory 1030 and the storage 1060 may be storage media including at least one of a volatile medium, a non-volatile medium, a detachable medium, a non-detachable medium, a communication medium, or an information delivery medium, or a combination thereof. For example, the memory 1030 may include ROM 1031 or RAM 1032.

According to the disclosed embodiment, noise source impedance may be measured in order to solve the problems of noise generation and external electromagnetic interference in an electronic device.

According to the disclosed embodiment, a rated capacity limit of a coupler used for measurement of noise source impedance may be overcome.

According to the disclosed embodiment, a measurable frequency range may be extended in order to analyze the effects of a wide frequency band signal.

Although the embodiments of the present disclosure have been described with reference to the accompanying drawings, those skilled in the art will appreciate that the present disclosure may be practiced in other specific forms without changing the technical spirit or essential features of the present disclosure. Therefore, the embodiments described above are illustrative in all aspects and should not be understood as limiting the present disclosure.

What is claimed is:

1. A method for extracting noise source impedance of an electronic device, comprising:

calculating impedance of a noise source of a measurement target device using a first probe and a second probe, wherein each of the first probe and the second probe has a cable wound therearound, wherein a number of turns of the cable wound around each of the first probe and the second probe is adjusted by increasing or decreasing windings of the cable around the probes to a number of turns determined based on a change in an S-parameter obtained from an input signal injected through the first probe and an output signal received through the second probe, the S-parameter being measured over a frequency range of the noise source.

2. The method of claim 1, further comprising:

measuring an initial impedance of the measurement target device using the first probe and the second probe;

determining the number of turns of the cable based on a change in the S-parameter obtained from the initial impedance measurement;

adjusting the number of turns of the cable wound around each of the first probe and the second probe to the determined number of turns of the cable; and measuring impedance of the measurement target device after the adjustment.

3. The method of claim 2, wherein measuring the initial impedance and measuring the impedance includes:

injecting an input signal through the first probe;

receiving an output signal fed back from the measurement target device through the second probe; and calculating an S-parameter that is based on a ratio between the input signal and the output signal.

4. The method of claim 2, wherein measuring the initial impedance comprises measuring the impedance when the number of turns of the cable wound around each of the probes is set to one turn.

5. The method of claim 2, wherein determining the number of turns includes:

determining an increment in the S-parameter obtained from the initial impedance measurement; and calculating the number of turns of the cable based on the determined increment in the S-parameter.

6. The method of claim 5, wherein the increment in the S-parameter is determined based on at least one of a user-defined criterion or specifications of measurement equipment.

7. The method of claim 2, wherein determining the number of turns, adjusting the number of turns, and measuring the impedance are repeatedly performed for different numbers of turns of the cable.

8. The method of claim 2, further comprising:

identifying, for each number of turns of the cable, a frequency range in which the impedance measurement satisfies a predefined accuracy criterion; and generating a combined impedance profile by selecting and combining impedance measurement results from the identified frequency ranges corresponding to different numbers of turns.

9. An apparatus for extracting noise source impedance of an electronic device, comprising:

a first probe and a second probe that are connected to a measurement target device, each of the first probe and the second probe having a cable wound therearound; and a measurement control unit for configured to:

inject an input signal through the first probe, receive an output signal fed back from the measurement target device through the second probe, calculate an S-parameter based on a ratio between the input signal and the output signal, determine a number of turns of the cable based on a change in the S-parameter, and adjust the number of turns of the cable wound around each of the first probe and the second probe by increasing or decreasing windings of the cable around the probes to the determined number of turns, the S-parameter being measured over a frequency range of a noise source.

10. The apparatus of claim 9, wherein the measurement control unit is further configured to:

measure an initial impedance of the measurement target device using the first probe and the second probe;

determine the number of turns of the cable based on a change in the S-parameter obtained from the initial impedance measurement;

adjust the number of turns of the cable wound around each of the first probe and the second probe to the determined number of turns of the cable;

measure impedance of the measurement target device after the adjustment;

identify, for each number of turns of the cable, a frequency range in which the impedance measurement satisfies a predefined accuracy criterion; and generate a combined impedance profile by selecting and combining impedance measurement results from the identified frequency ranges corresponding to different numbers of turns.

11. The apparatus of claim 10, wherein the measurement control unit is configured to measuring the initial impedance when the number of turns of the cable wound around each of the probes is set to one turn.

12. The apparatus of claim 11, wherein the measurement control unit is configured to determine the number of turns by:

determining an increment in the S-parameter obtained from the initial impedance measurement; and calculating the number of turns of the cable based on the determined increment in the S-parameter.

13. The apparatus of claim 12, wherein the increment in the S-parameter is determined based on at least one of a user-defined criterion or specifications of measurement equipment.

14. The apparatus of claim 10, wherein the measurement control unit is configured to repeatedly perform determining the number of turns, adjusting the number of turns, and measuring the impedance for different numbers of turns of the cable.

15. The apparatus of claim 9, further comprising:

a line impedance stabilization network for stabilizing line impedance depending on a frequency and isolating a power network from the measurement target device.

16. A method for extracting noise source impedance of an electronic device, comprising:

measuring an initial impedance of a measurement target device using a first probe and a second probe, each of the first probe and the second probe having a cable wound therearound;

injecting an input signal through the first probe and receiving an output signal from the measurement target device through the second probe;

calculating an S-parameter based on a ratio between the input signal and the output signal;

determining a number of turns of the cable based on a change in the S-parameter measured over a frequency range of a noise source;

adjusting the number of turns of the cable wound around each of the first probe and the second probe by increasing or decreasing windings of the cable around the probes to the determined number of turns;

measuring impedance of the measurement target device after the adjustment;

identifying, for each number of turns of the cable, a frequency range in which the impedance measurement satisfies a predefined accuracy criterion; and generating a combined impedance profile by selecting and combining impedance measurement results from the identified frequency ranges corresponding to different numbers of turns.

17. The method of claim 16, wherein measuring the initial impedance comprises measuring the impedance when the number of turns of the cable wound around each of the probes is set to one turn.

18. The method of claim 16, wherein determining the number of turns includes:

determining an increment in the S-parameter obtained from the initial impedance measurement; and calculating the number of turns of the cable based on the determined increment in the S-parameter.

19. The method of claim 18, wherein the increment in the S-parameter is determined based on at least one of a user-defined criterion or specifications of measurement equipment.

20. The method of claim 16, wherein determining the number of turns, adjusting the number of turns, and measuring the impedance are repeatedly performed for different numbers of turns of the cable.

* * * * *